US010903048B2

(12) United States Patent
Wu et al.

(10) Patent No.: US 10,903,048 B2
(45) Date of Patent: Jan. 26, 2021

(54) SUBSTRATE PROCESSING METHOD AND APPARATUS FOR CONTROLLING PHASE ANGLES OF HARMONIC SIGNALS

(71) Applicant: Applied Materials, Inc., Santa Clara, CA (US)

(72) Inventors: Yui Lun Wu, Castro Valley, CA (US); Jozef Kudela, Morgan Hill, CA (US); Carl A. Sorensen, Morgan Hill, CA (US); Suhail Anwar, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 80 days.

(21) Appl. No.: 16/031,701

(22) Filed: Jul. 10, 2018

(65) Prior Publication Data

US 2019/0043695 A1 Feb. 7, 2019

Related U.S. Application Data

(60) Provisional application No. 62/531,963, filed on Jul. 13, 2017.

(51) Int. Cl.

| | |
|---|---|
| ***C23C 16/52*** | (2006.01) |
| ***C23C 16/44*** | (2006.01) |
| ***C23C 16/455*** | (2006.01) |
| ***C23C 16/509*** | (2006.01) |
| ***H01J 37/32*** | (2006.01) |

(Continued)

(52) U.S. Cl.

CPC .... *H01J 37/32183* (2013.01); *C23C 16/4405* (2013.01); *C23C 16/45565* (2013.01); *C23C 16/5096* (2013.01); *C23C 16/52* (2013.01); *H01J 37/32* (2013.01); *H01J 37/32091* (2013.01); *H01J 37/32165* (2013.01); *H01J 37/32458* (2013.01);

(Continued)

(58) Field of Classification Search

None

See application file for complete search history.

(56) References Cited

U.S. PATENT DOCUMENTS 5,325,019 A * 6/1994 Miller ............... H01J 37/32082 204/192.13

5,576,629 A * 11/1996 Turner ................. B24B 37/013 118/708

(Continued)

OTHER PUBLICATIONS

International Search Report and Written Opinion dated Oct. 31, 2018 for PCT/US2018/040367.

(Continued)

*Primary Examiner* — Jose I Hernandez-Kenney

(74) *Attorney, Agent, or Firm* — Patterson + Sheridan LLP

(57) ABSTRACT

A method of processing a material layer on a substrate is provided. The method includes delivering RF power from an RF power source through a match network to a showerhead of a capacitively coupled plasma chamber; igniting a plasma within the capacitively coupled plasma chamber; measuring one or more phase angles of one or more harmonic signals of the RF power relative to a phase of a fundamental frequency of the RF power; and adjusting at least one phase angle of at least one harmonic signal of the RF power relative to the phase of the fundamental frequency of the RF power based on the one or more phase angle measurements.

20 Claims, 4 Drawing Sheets

(51) Int. Cl.
*H03H 7/38* (2006.01)
*H03H 7/40* (2006.01)

(52) U.S. Cl.
CPC ........ *H01J 2237/3321* (2013.01); *H03H 7/38* (2013.01); *H03H 7/40* (2013.01)

(56) References Cited

U.S. PATENT DOCUMENTS 6,351,683 B1 * 2/2002 Johnson ............ H01J 37/32082 156/345.28
7,004,107 B1 * 2/2006 Raoux ............... C23C 16/45565 118/663
7,879,185 B2 2/2011 Shannon et al.
8,053,991 B2 * 11/2011 Kim ......................... H03H 7/40 315/111.21
9,425,026 B2 8/2016 Anwar et al.
2003/0079983 A1 5/2003 Long et al.
2003/0201069 A1 10/2003 Johnson
2005/0134186 A1 * 6/2005 Brouk ............... H01J 37/32183 315/111.21
2006/0170367 A1 8/2006 Bhutta
2008/0008842 A1 * 1/2008 Soo ................... H01J 37/32165 427/569
2011/0114599 A1 * 5/2011 Koshimizu ....... H01J 37/32091 216/61
2012/0273341 A1 * 11/2012 Agarwal ........... H01J 37/32165 204/164
2013/0071581 A1 3/2013 Baek et al.
2014/0216344 A1 8/2014 Kudela et al.
2014/0265833 A1 * 9/2014 Albarede ................. H05H 1/46 315/39
2015/0318223 A1 11/2015 Bhutta
2016/0049280 A1 2/2016 Kudela et al.
2017/0062186 A1 * 3/2017 Coumou ........... H01J 37/32165

OTHER PUBLICATIONS

Frenzel, Lou, “Back to Basics: Impedance Matching (Part 3),” Electronic Design, Mar. 1, 2012, http://www.electronicdesign.com/communications/back-basics-impedance-matching-part-2.
Frenzel, Lou, “Back to Basics: Impedance Matching (Part 3),” Electronic Design, Mar. 15, 2012, http://www.electronicdesign.com/communications/back-basics-impedance-matching-part-3.

* cited by examiner 100
101
CONTROLLER
50
RF POWER
128
190
REMOTE SOURCE
130
GAS SOURCE
132
102
104
105
106
108
110
112
114
116
118
120
122
124
126
134
136
142
144
146
148
150
152
154
156

SUBSTRATE PROCESSING METHOD AND APPARATUS FOR CONTROLLING PHASE ANGLES OF HARMONIC SIGNALS

CROSS-REFERENCE TO RELATED APPLICATIONS

This application claims benefit of U.S. provisional patent application Ser. No. 62/531,963, filed Jul. 13, 2017, which is hereby incorporated herein by reference.

BACKGROUND OF THE INVENTION

Field of the Invention

Embodiments of the present disclosure generally relate to an apparatus and method for processing substrates in a processing chamber using a plasma.

Description of the Related Art

In the manufacture of integrated circuits and other electronic devices, plasma processes are often used for deposition or etching of various material layers on substrates. As demand for flat panels and solar cells has increased, so has the demand for larger sized substrates. This growth in the size of the large area substrates has presented new challenges in handling and production. For example, the larger surface area of the substrates has resulted in increased RF power requirements, which in turn, has increased the size and cost of RF power transmission components. Since the equipment's size and power consumption of processing equipment suitable for large area substrates and conventional semiconductor wafers differ by orders of magnitude, mere scale-up of conventional solutions does not provide acceptable or in some cases even predictable results, thus demanding new innovations to enable next generation process and equipment.

High frequency power, such as a radio frequency (RF) power, is often used to generate the plasma, for example inside a process chamber. The RF power can be applied to one or more portions of the process chamber, such as the gas distribution assembly of the process chamber or a substrate support in the process chamber. As dimensions of the substrates increase and structures formed on substrates used in display fabrication processes continue to shrink, process uniformity and consistency becomes ever more important. To achieve uniform and consistent results in substrate processing, process conditions (e.g., temperatures, pressures, flowrates, frequencies of RF power) are maintained to be as consistent as possible. Despite the benefits achieved by maintaining consistent process conditions (e.g., temperatures, pressures, flowrates, frequencies of RF power), uniform and consistent results of processed material layers remains a challenge. Uniform and consistent processing becomes an even greater challenge as the size of the substrates has increased, such as for substrates having a surface area for processing (e.g., depositions) of greater than about 1 $m^2$, such as greater than about 10 $m^2$. Therefore, there is a need for an improved method and apparatus for plasma processing of substrates.

SUMMARY OF THE INVENTION

Embodiments of the disclosure generally relate to a plasma processing apparatus and methods of using the same. In one embodiment, a method of processing a material layer on a substrate is provided. The method includes delivering RF power from an RF power source through a match network to a showerhead of a capacitively coupled plasma chamber; igniting a plasma within the capacitively coupled plasma chamber; measuring one or more phase angles of one or more harmonic signals of the RF power relative to a phase of a fundamental frequency of the RF power; and adjusting at least one phase angle of at least one harmonic signal of the RF power relative to the phase of the fundamental frequency of the RF power based on the one or more phase angle measurements.

In another embodiment, a method of processing a material layer on a substrate is provided. The method includes delivering RF power from an RF power source through a match network to a showerhead of a capacitively coupled plasma chamber; igniting a plasma within the capacitively coupled plasma chamber; measuring one or more phase angles of one or more harmonic signals of the RF power relative to a phase of a fundamental frequency of the RF power; and adjusting an impedance of at least one electronic component in the match network based on the one or more phase angle measurements.

In another embodiment, a method of processing a material layer on a substrate is provided. The method includes delivering RF power from an RF power source through a match network to a showerhead of a capacitively coupled plasma chamber; igniting a plasma within the capacitively coupled plasma chamber; measuring a phase angle of a reflected RF power relative to a phase of a fundamental frequency of the delivered RF power; and adjusting a phase angle of the reflected RF power relative to the phase of the fundamental frequency of the RF power based on the phase angle measurement of the reflected RF power.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
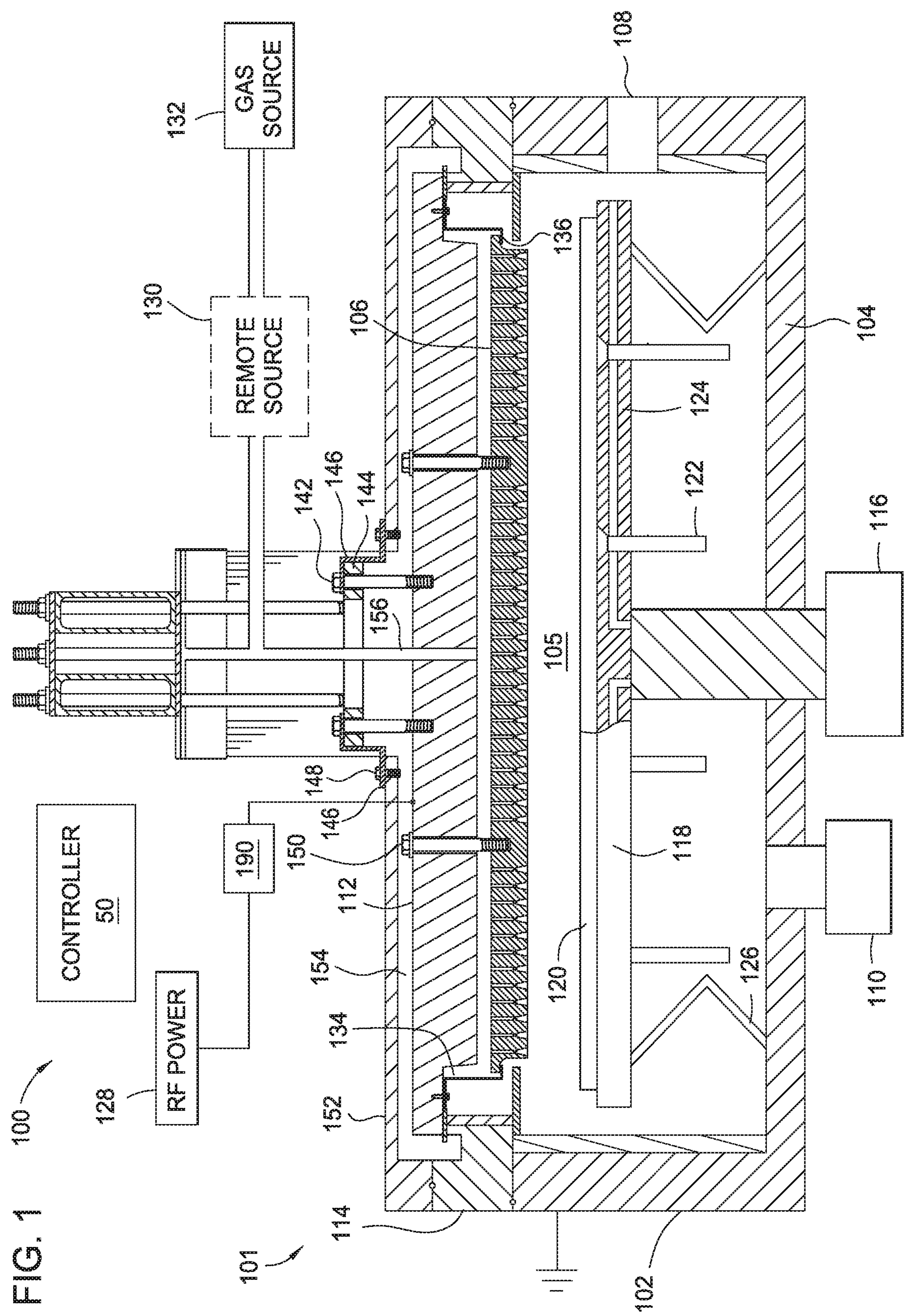
FIG. 1 is a cross sectional view of a PECVD apparatus, according to one embodiment.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

Embodiments of the disclosure include a method and apparatus for improving the plasma processing results within a chamber of a processing system and/or for reducing the variation in plasma process results from chamber-to-chamber within a system, or between systems, by compensating for non-linear loads found in the similarly configured plasma processing chambers found within the processing system(s). One example of a processing system is shown below in FIG. 1.

FIG. 1 is a cross sectional view of a PECVD apparatus 100, according to one embodiment. The apparatus 100 includes a chamber 101 in which one or more material layers can be processed (e.g., deposited or etched) on a substrate 120. The chamber 101 generally includes walls 102, a bottom 104 and a showerhead 106 which together enclose a process volume 105. A substrate support 118 is disposed within the process volume 105. The process volume 105 is accessed through a slit valve opening 108 such that the substrate 120 may be transferred in and out of the chamber 101. The substrate support 118 may be coupled to an actuator 116 to raise and lower the substrate support 118. Lift pins 122 are moveably disposed through the substrate support 118 to move a substrate to and from a substrate receiving surface of the substrate support 118. The substrate support 118 may also include heating and/or cooling elements 124 to maintain the substrate support 118 at a desired temperature. The substrate support 118 may also include RF return straps 126 to provide an RF return path at the periphery of the substrate support 118 to the chamber bottom 104 or walls 102, which can be connected to an electrical ground.

The showerhead 106 is coupled to a backing plate 112 by one or more fastening mechanisms 150 to help prevent sag and/or control the straightness/curvature of the showerhead 106. In one embodiment, twelve fastening mechanisms 150 may be used to couple the showerhead 106 to the backing plate 112.

A gas source 132 is coupled to the backing plate 112 through a gas conduit 156 to provide gas through gas passages in the showerhead 106 to a processing area between the showerhead 106 and the substrate 120. A vacuum pump 110 is coupled to the chamber 101 to control the process volume at a desired pressure. An RF power source 128 is coupled through a match network 190 to the backing plate 112 and/or directly to the showerhead 106 to provide RF power to the showerhead 106. The RF power creates an electric field between the showerhead 106 and the substrate support 118 so that a plasma may be generated from the gases disposed between the showerhead 106 and the substrate support 118. The substrate support 118 may be connected to an electrical ground. Various frequencies may be used, such as a frequency between about 0.3 MHz and about 200 MHz. In one embodiment, the RF current is provided at a frequency from about 12.88 MHz to about 14.24 MHz, such as 13.56 MHz.

In some embodiments, a remote plasma source 130, such as an inductively coupled remote plasma source 130, may also be coupled between the gas source 132 and the backing plate 112. Between processing substrates, a cleaning gas may be provided to the remote plasma source 130 so that a remote plasma is generated. The radicals from the remote plasma may be provided to chamber 101 to clean chamber 101 components. The cleaning gas may be further excited by the RF power source 128 provided to the showerhead 106. Suitable cleaning gases include but are not limited to $NF_3$, $F_2$, $SF_6$ and $Cl_2$. The spacing between the top surface of the substrate 120 and the showerhead 106 may be between about 400 mil and about 1,200 mil. In one embodiment, the spacing may be between about 400 mil and about 800 mil.

The showerhead 106 may additionally be coupled to the backing plate 112 by showerhead suspension 134. In one embodiment, the showerhead suspension 134 is a flexible metal skirt. The showerhead suspension 134 may have a lip 136 upon which the showerhead 106 may rest. The backing plate 112 may rest on an upper surface of a ledge 114 coupled with the chamber walls 102 to seal the chamber 101. A chamber lid 152 may be coupled with the chamber walls 102 and spaced from the backing plate 112 by area 154. In one embodiment, the area 154 may be an open space (e.g., a gap between the chamber walls and the backing plate 112). In another embodiment, the area 154 may be an electrically insulating material. The chamber lid 152 may have an opening therethrough to permit the one or more fasteners 142 to couple with the backing plate 112 and the gas feed conduit 156 to supply processing gas to the chamber 101.

In one embodiment, a support ring 144 may be substantially centered within the opening of the chamber lid 152. The support ring 144 may be coupled with the backing plate 112 by the one or more fasteners 142. An RF return plate 146 may be coupled with the ring 144 and the chamber lid 152. The RF return plate 146 may be coupled with the chamber lid 152 by a fastening mechanism 148. The RF return plate 146 may be coupled between the fasteners 142 and the ring 144. The RF return plate 146 provides a return path to the RF power source 128 for any RF current that may travel up the fasteners 142 to the ring 144. The RF return plate 146 provides a path for the RF current to flow back down to the chamber lid 152 and then to the RF power source 128.

The PECVD apparatus 100 further includes a system controller 50. The system controller 50 is used to control operation of the processes executed with PECVD apparatus 100 including the delivery of RF power to the showerhead 106 from the RF power source 128. The system controller 50 is generally designed to facilitate the control and automation of the chamber 101 and may communicate to the various sensors, actuators, and other equipment associated with the chamber 101 through wired or wireless connections. The system controller 50 typically includes a central processing unit (CPU) (not shown), memory (not shown), and support circuits (or I/O) (not shown). The CPU may be one of any form of computer processors that are used in industrial settings for controlling various system functions, substrate movement, chamber processes, and control support hardware (e.g., sensors, internal and external robots, motors, gas flow control, etc.), and monitor the processes performed in the system (e.g., RF power measurements, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 50 determines which tasks are performable on a substrate in the process chamber 101. Preferably, the program is software readable by the system controller 50 that includes code to perform tasks relating to monitoring, execution and control of the movement, support, and/or positioning of a substrate along with the various process recipe tasks (e.g., inspection operations, processing environment controls) and various chamber process recipe operations being performed in the process chamber 101.

In order to effectively transfer the RF power to the process gases disposed within the process volume 105 of the process chamber to create and maintain the RF plasma, the match network 190 is used to match the impedance of the RF power source 128 with the load (i.e., the plasma formed within the process volume). When the impedance of the RF power source 128 is not matched to the load, portions of the RF energy from the RF power source are reflected back to the RF power source. These reflections reduce the efficiency of the RF power that is transferred to the plasma and if these reflections are large enough, the reflections can interfere with the RF signal from the RF power source 128, destabilize the RF power source 128 or damage components in the circuits that supply the RF power to the chamber 101.

An RF plasma is an example of a non-linear load and non-linear loads result in the generation of harmonics of the RF current and RF voltage signals at multiples of the fundamental frequency of the RF signal. For example, a second-order harmonic signal occurs at twice the frequency (e.g., 27.12 MHz) of a fundamental frequency (e.g., 13.56 MHz) supplied by the RF power source 128. The non-linear effects created by the non-linear load will tend to distort the RF voltage and RF current waveforms within each period of the generated RF waveform, which have been found to have a significant effect on the plasma processing results on a substrate. It is believed that controlling the phase angle of these harmonic signals, such as the phase angle of the second-order and third-order harmonics relative to the fundamental frequency of the RF power as well as the phase angle of any reflected RF power at the fundamental frequency can help promote consistent and uniform substrate processing of a given material layer, and that control of the phase angle can be especially helpful with promoting consistent and uniform process results for large substrates, such as for substrates having a surface area for processing (e.g., depositions) of greater than about 1 $m^2$, such as greater than about 10 $m^2$. The phase angle of these harmonic signals or reflected RF power relative to the fundamental frequency can be controlled during processing by making adjustments to various components in the match network 190, such as variable capacitors and/or variable inductors in the match network 190. A change in the RF cable length from the RF power source 128 can also be used to make adjustments to these phase angles, but this is generally not a practical solution to resolve this problem in substrate processing chambers in most substrate fabrication facilities where the chamber supporting components are not positioned at the processing chamber, especially a process chamber for large substrates.

Figure 2A:
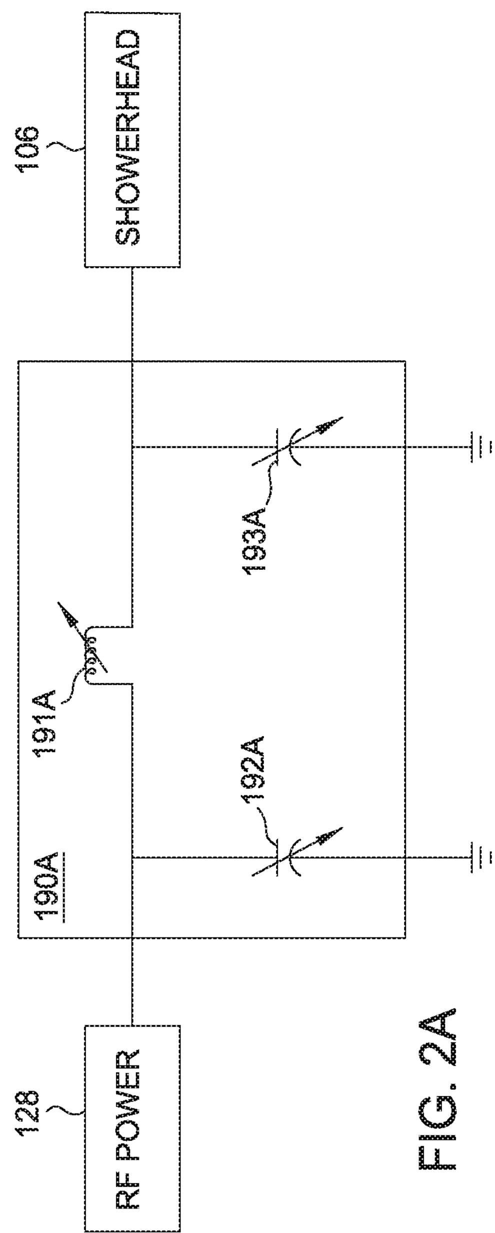
FIG. 2A illustrates a match network using a π-network configuration, according to one embodiment.
Figure 2B:
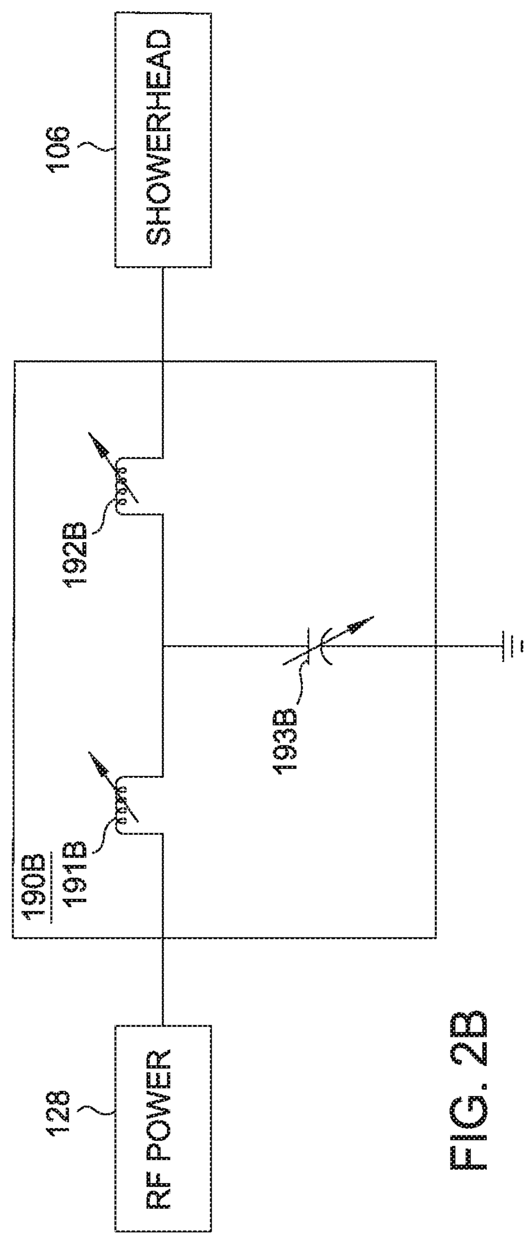
FIG. 2B illustrates a match network using a T-network configuration, according to one embodiment.

FIGS. 2A and 2B illustrate different circuit configurations of the match network 190 illustrated in FIG. 1. FIG. 2A illustrates a match network 190A using a π-network configuration, according to one embodiment. The match network 190A includes a variable inductor 191A, a first variable capacitor 192A, and a second variable capacitor 193A. The three electronic components 191A-193A of the π-network configuration offer additional degrees of freedom relative to the conventional L-network configuration often used for impedance matching today.

Figure 2C:
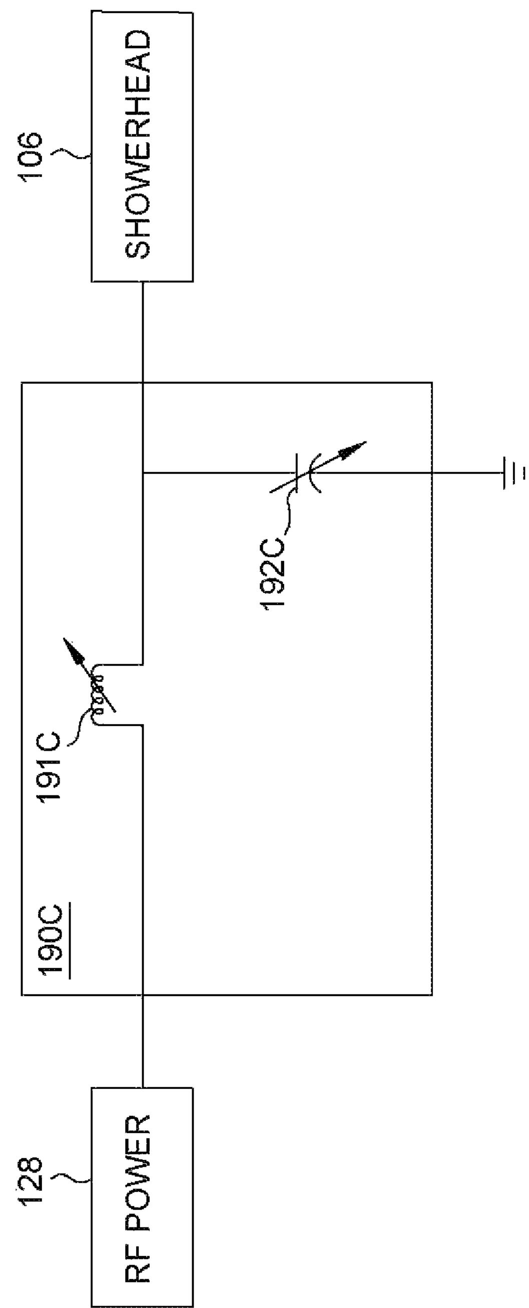
FIG. 2C illustrates a match network using a conventional L-network configuration.

FIG. 2C illustrates a match network 190C using a conventional L-network configuration. The match network 190C includes a variable inductor 191C and a first variable capacitor 192C. The variable inductor 191C is electrically connected between the RF power source 128 and the electrode, such as the showerhead 106. The first variable capacitor 192C is electrically connected between the RF power source 128 and an electrical ground on the RF load side (i.e., showerhead 106) of the variable inductor 191C. For impedance matching in an L-network configuration, there is only one set of capacitance and inductance values for matching a given load impedance at a given radio frequency. Although L-network configurations can be rearranged in which the position of the inductor and capacitor are switched or in which the ground component (e.g., variable capacitor 192C in FIG. 2C) is connected on the RF power side instead of the RF load side, there will still only be one set of capacitance and inductance values for matching a given load impedance at a given radio frequency.

Conversely, the additional degrees of freedom offered by the π-network configuration of FIG. 2A and the T-network configuration described in reference to FIG. 2B below, which each include three electronic components (e.g., one inductor and two capacitors), allow for an infinite number of solutions (i.e., capacitance and inductance values) for matching a given impedance at a selected radio frequency. This additional degree of freedom allows for the source and load impedances to be actively matched by use of the corresponding match network 190A, 190B while also allowing for phase angles to be separately adjusted and/or controlled, such as the phase angles of harmonic signals relative to the fundamental frequency of the RF power.

Referring to FIG. 2A, the variable inductor 191A is electrically connected between the RF power source 128 and the showerhead 106. The first variable capacitor 192A is electrically connected between the RF power source 128 and an electrical ground on the RF power source 128 side of the variable inductor 191A. The second variable capacitor 193A is arranged in parallel with the first variable capacitor 192A and is electrically connected between the RF power source 128 and an electrical ground connected to the RF load (i.e., showerhead 106) side of the variable inductor 191A. In an alternative π-network configuration, the variable inductor 191A may be replaced with a variable capacitor, and the variable capacitors 192A, 193A may be replaced with variable inductors.

Since the π-network configuration found in match network 190A has three electronic components 191A-193A, the phase angle of the harmonic signals can be adjusted while also making adjustments to match the impedance of the RF power source 128 with the impedance of the RF load (i.e., the plasma). In general, the impedance matching of the formed circuit is controlled separately from the phase angle of the harmonic signals. For example, various combinations of the inductance settings and capacitance settings of the corresponding electronic components 191A-193A can result in a same impedance of the RF power source 128, but these different combinations can lead to an ability to control the phase angle of one or more of the harmonic signals (e.g., the second-order and third-order harmonic signals) relative to the fundamental frequency of the RF power source while the source and load impedances are matched. Controlling of the phase angle of one or more harmonic signals (e.g., the second-order and third-order harmonic signals) relative to the fundamental frequency promotes uniform and consistent results for processing a particular material layer (e.g., a silicon nitride layer deposition) in a plasma chamber, such as chamber 101 shown in FIG. 1. In some embodiments using match network 190A, the impedance match in combination with the phase angle control of one or more of the harmonic signals is accomplished by modifying at least one capacitance and/or at least one inductance in the match network 190A for a given set of process conditions (e.g., RF power magnitude, RF power frequency, process volume temperature and pressure, gas flowrates and compositions, and the particular material layer being processed). In other embodiments using match network 190A, the impedance match in combination with the phase angle control of one or more of the harmonic signals is accomplished by modifying at least two capacitances and at least one inductance in the match network 190A for a given set of process conditions. The match network 190A may also be used to control the phase angle of reflected RF power for a given impedance mismatch between the RF power source and the load (i.e., the plasma) for a given set of process conditions.

Once desirable process results are obtained on a particular apparatus (e.g., PECVD apparatus 100) for processing a particular material layer (e.g., silicon nitride deposition), the same process conditions can be used to repeat the processing of the particular material layer with the particular apparatus, where the process conditions for the repeated process further include at least a phase angle of one or more harmonic signals of the RF power or the phase angle of the reflected RF power relative to the fundamental frequency of the RF power. Using the same process conditions including the phase angles mentioned above can help achieve consistent, uniform, and desirable process results when processing a particular material layer in a process chamber or within two or more similarly configured process chambers.

FIG. 2B illustrates a match network 190B using a T-network configuration, according to one embodiment. The match network 190B includes a first variable inductor 191B, a second variable inductor 192B, and a variable capacitor 193B. Similar to the π-network configuration described above in reference to FIG. 2A, the three electronic components 191B-193B of the T-network configuration offer an additional degree of freedom relative to the conventional L-network configuration often used for impedance matching. This additional degree of freedom allows for the source and load impedances to be matched while also allowing for phase angles to be adjusted, such as the phase angles of harmonic signals relative to the fundamental frequency of the RF power.

The first variable inductor 191B and the second variable inductor 192B are arranged in series between the RF power source 128 and the showerhead 106. The first variable inductor 191B is disposed between the RF power source 128 and the second variable inductor 192B. The second variable inductor 192B is disposed between the first variable inductor 191B and the showerhead 106. The variable capacitor 193B is connected to the electrical ground between the first variable inductor 191B and the second variable inductor 192B. In an alternative T-network configuration, the second variable inductor 192B may be replaced with a variable capacitor.

Since the T-network configuration found in the match network 190B has three electronic components 191B-193B, the phase angle of the harmonic signals can be adjusted while also making adjustments to match the impedance of the RF power source 128 with the impedance of the RF load (i.e., the plasma). For example, various combinations of the inductance setting and capacitance setting of the corresponding electronic components 191B-193B can result in a same impedance of the RF power source 128, but these different combinations can lead to an ability to control the phase angle of one or more of the harmonic signals (e.g., the second-order and third-order harmonic signals) relative to the fundamental frequency of the RF power source while the source and load impedances are matched. Controlling of the phase angle of one or more harmonic signals (e.g., the second-order and third-order harmonic signals) relative to the fundamental frequency promotes uniform and consistent results for processing a particular material layer (e.g., a silicon nitride layer deposition) in a plasma chamber, such as chamber 101 shown in FIG. 1. In some embodiments using match network 190B, the impedance match in combination with the phase angle control of one or more of the harmonic signals is accomplished by modifying at least one capacitance and at least one inductance in the match network 190B for a given set of process conditions (e.g., RF power magnitude, RF power frequency, process volume temperature and pressure, gas flowrates and compositions, and the particular material layer being processed). In other embodiments using match network 190B, the impedance match in combination with the phase angle control of one or more of the harmonic signals is accomplished by modifying at least one capacitance and at least two inductances in the match network 190B for a given set of process conditions. The match network 190B may also be used to control the phase angle of reflected RF power for a given impedance mismatch between the RF power source and the load (i.e., the plasma) for a given set of process conditions.

Once desirable process results are obtained on a particular apparatus (e.g., PECVD apparatus 100) for processing a particular material layer (e.g., silicon nitride deposition), the same process conditions can be used to repeat the processing of the particular material layer with the particular apparatus, where the process conditions for the repeated process further include at least a phase angle of one or more harmonic signals of the RF power or the phase angle of the reflected RF power relative to the fundamental frequency of the RF power. Using the same process conditions including the phase angles mentioned above can help achieve consistent, uniform, and desirable results when processing a particular material layer in a process chamber or within two or more similarly configured process chambers.

Figure 3:
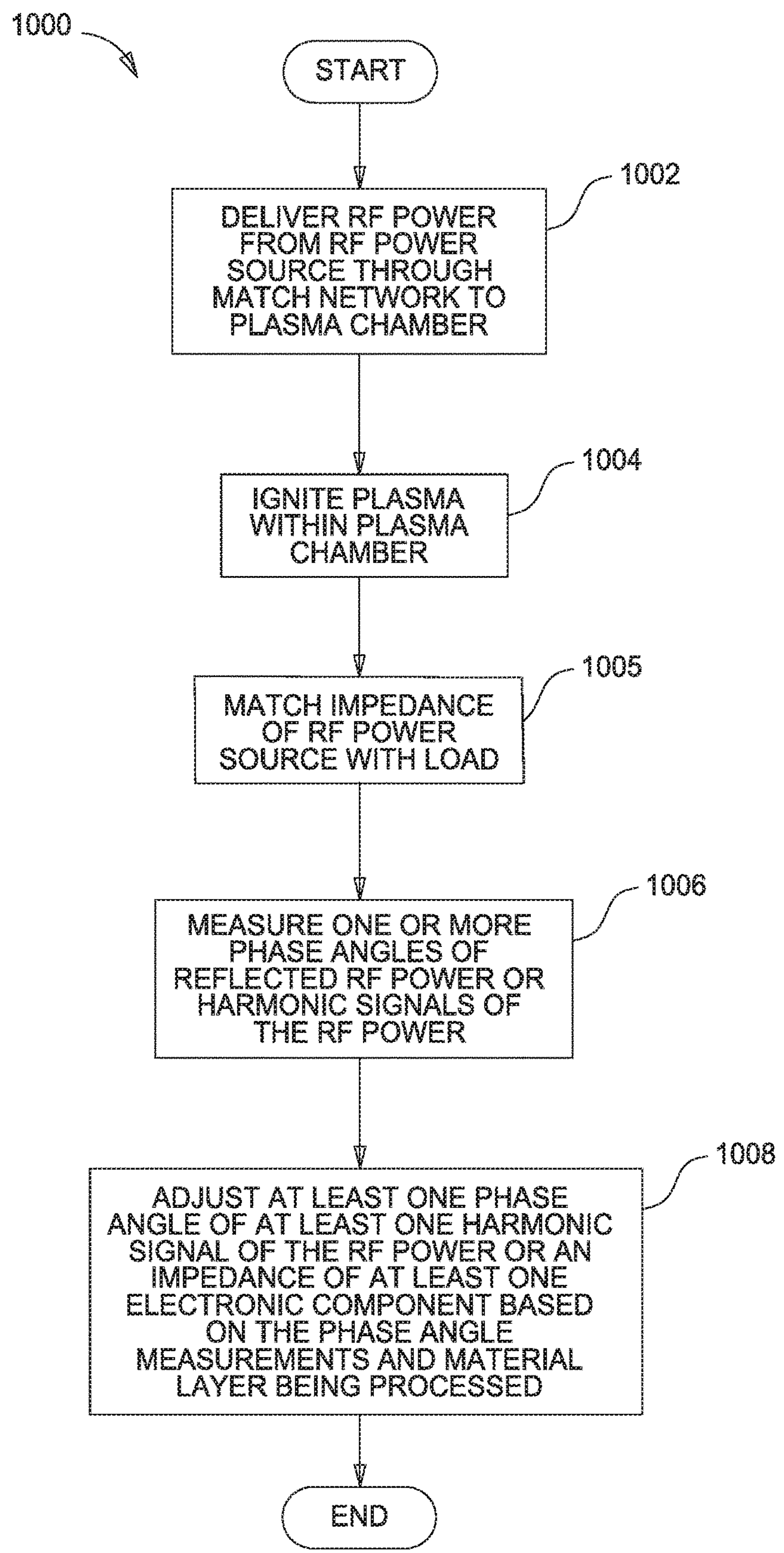
FIG. 3 is a process flow diagram of a method for processing a material layer on a substrate by adjusting the phase angle of at least one signal of the RF power delivered to a chamber in the PECVD apparatus of FIG. 1, according to one embodiment.

FIG. 3 is a process flow diagram of a method 1000 for processing a material layer on a substrate by adjusting the phase angle of at least one signal of the RF power delivered to the chamber 101 in the PECVD apparatus 100 of FIG. 1, according to one embodiment. In an effort to simplify the discussion of the method steps found in method 1000 the discussion below has been written so that either of the network configurations described in reference to FIGS. 2A and 2B can be used. However, the selection of match network 190A versus match network 190B can be based on the desired fundamental frequencies used during RF plasma processing since π-networks generally have a low impedance at high frequencies and T-networks have a high impedance at high frequencies. Referring to FIGS. 1, 2A, 2B, and 3, the method 1000 is described.

At block 1002, RF power is delivered from the RF power source 128 through the match network (e.g., match network 190A of FIG. 2A or match network 190B of FIG. 2B) to the showerhead 106 of the capacitively coupled plasma chamber 101. At block 1004, a plasma is ignited in the capacitively coupled plasma chamber 101 by the RF power supplied in block 1002.

At block 1005, the controller 50 adjusts at least one of the three electronic components (e.g., components 191A-193A or components 191B-193B) found in the corresponding match network 190A, 190B to match the RF power source 128 and load impedances to achieve a desired forward and reflected RF power.

At block 1006, one or more phase angles of one or more harmonic signals (e.g., the second-order and third-order harmonic signals) of the RF power are measured relative to the fundamental frequency of the RF power. In some embodiments, the phase angle measurements can include measurements of the phase angle of reflected RF power relative to the fundamental frequency of the RF power.

At block 1008, one or more phase angles of the one or more harmonic signals (e.g., the second-order and third-order harmonic signals) of the RF power are adjusted relative to the fundamental frequency of the RF power based on the one or more phase angle measurements and the material layer (e.g., a silicon nitride deposition) being processed. The phase angle of the one or more harmonic signals may be adjusted relative to the phase of the fundamental frequency of the RF power while holding the impedance of the RF power source 128 constant using the methods described above in reference to FIGS. 2A and 2B. For example, an operator of the PECVD apparatus 100 may observe that desirable consistent and uniform processing results may be obtained for a plasma enhanced chemical vapor deposition of a silicon nitride layer when the impedance is matched and the phase angle of the second-order harmonic signal is offset from the phase of the fundamental frequency by 20 degrees. The operator and/or system controller 50 can then make adjustments to the capacitance value(s) and/or inductances value(s) of one or more of the electronic components in the match network, such as the match networks 190A and 190B of FIGS. 2A and 2B respectively, to match the source and load impedances and control the phase angle of the second-order harmonic signal to be offset from the phase of the fundamental frequency to 20 degrees. Furthermore, the phase angle offset of one or more of the harmonic signals can also be dependent on the operating RF power magnitude (e.g., 1000 Watts) and the frequency of the RF power (e.g., 13.56 MHz).

In embodiments in which the phase angle of the reflected RF power is measured at block 1006, the phase angle of the reflected RF power may be adjusted relative to the phase of the fundamental frequency of the RF power.

While the foregoing is directed to embodiments of the present disclosure, other and further embodiments of the disclosure may be devised without departing from the basic scope thereof, and the scope thereof is determined by the claims that follow.

The invention claimed is:

1. A method of processing a material layer on a substrate, comprising:

delivering RF power from an RF power source through a match network to a showerhead to ignite a plasma within a processing region of a capacitively coupled plasma chamber, wherein delivering RF power comprises:

measuring one or more phase angles of one or more harmonic signals of the delivered RF power relative to a phase of a fundamental frequency of the delivered RF power; and adjusting at least one phase angle of at least one harmonic signal of the delivered RF power relative to the phase of the fundamental frequency of the delivered RF power based on the one or more phase angle measurements such that the at least one phase angle of the at least one harmonic signal of the delivered RF power relative to the phase of the fundamental frequency of the delivered RF power is offset from the phase of the fundamental frequency of the delivered RF power, wherein the adjusting of the at least one phase angle of the at least one harmonic signal of the delivered RF power includes modifying a capacitance or an inductance in the match network.

2. The method of claim 1, wherein the at least one phase angle adjusted is a phase angle of a second-order harmonic signal or a third-order harmonic signal of the delivered RF power.

3. The method of claim 1, wherein adjusting the at least one phase angle of the at least one harmonic signal of the delivered RF power relative to the phase of the fundamental frequency of the delivered RF power is also based on the particular material layer being processed.

4. The method of claim 1, further comprising matching an impedance of the RF power source with an impedance of an RF load, wherein the impedance matching is performed separately from adjusting the at least one phase angle of the at least one harmonic signal.

5. The method of claim 1, wherein the at least one phase angle is adjusted by modifying at least one inductance and at least two capacitances in the match network.

6. The method of claim 1, wherein the at least one phase angle is adjusted by modifying at least one capacitance and least two inductances in the match network.

7. The method of claim 1, wherein the match network includes a $\pi$-network configuration.

8. The method of claim 1, wherein the match network includes a T-network configuration.

9. The method of claim 1, wherein the at least one harmonic phase is adjusted without modifying an overall impedance of the RF power source that is matched with an impedance of an RF load, wherein the RF load includes the ignited plasma.

10. A method of processing a material layer on a substrate, comprising:

delivering RF power from an RF power source through a match network to a showerhead to ignite a plasma within a capacitively coupled plasma chamber, wherein delivering RF power comprises:

measuring one or more phase angles of one or more harmonic signals of the delivered RF power relative to a phase of a fundamental frequency of the delivered RF power; and adjusting an impedance of at least one electronic component in the match network based on the one or more phase angle measurements such that the one or more phase angles of the one or more harmonic signals of the delivered RF power relative to the phase of the fundamental frequency of the delivered RF power are controlled to be offset from the phase of the fundamental frequency of the delivered RF power.

11. The method of claim 10, wherein the impedance of the at least one electronic component is adjusted based on a phase angle measurement of a second-order harmonic signal of the delivered RF power relative to the phase of the fundamental frequency of the delivered RF power.

12. The method of claim 10, wherein the impedance of the at least one electronic component is adjusted based on a phase angle measurement of a third-order harmonic signal of the delivered RF power relative to the phase of the fundamental frequency of the delivered RF power.

13. The method of claim 10, wherein the adjusting an impedance of at least one electronic component includes modifying at least one inductance and at least two capacitances in the match network.

14. The method of claim 10, wherein the adjusting an impedance of at least one electronic component includes modifying at least one capacitance and least two inductances in the match network.

15. The method of claim 10, wherein the match network includes a π-network configuration.

16. The method of claim 10, wherein the adjusting at least one impedance includes modifying an impedance of at least three electronic components without modifying an overall impedance of the RF power source that is matched with an impedance of an RF load, wherein the RF load includes the ignited plasma.

17. A method of processing a material layer on a substrate, comprising:

delivering RF power from an RF power source through a match network to a showerhead to ignite a plasma within a processing region of a capacitively coupled plasma chamber, wherein delivering RF power comprises:

measuring one or more phase angles of one or more harmonic signals of the delivered RF power relative to a phase of a fundamental frequency of the delivered RF power; and adjusting at least one phase angle of at least one harmonic signal of the delivered RF power relative to the phase of the fundamental frequency of the delivered RF power based on the one or more phase angle measurements such that the at least one phase angle of the at least one harmonic signal of the delivered RF power relative to the phase of the fundamental frequency of the delivered RF power is offset from the phase of the fundamental frequency of the delivered RF power, wherein the at least one phase angle of the at least one harmonic signal of the delivered RF power is adjusted by:

modifying at least one inductance and at least two capacitances in the match network; or modifying at least one capacitance and least two inductances in the match network.

18. The method of claim 17, wherein the at least one phase angle adjusted is a phase angle of a second-order harmonic signal or a third-order harmonic signal of the delivered RF power.

19. The method of claim 17, wherein the match network includes a π-network configuration.

20. The method of claim 17, wherein the match network includes a T-network configuration.

* * * * *